(12) United States Patent
Sasaki

(10) Patent No.: US 7,223,703 B2
(45) Date of Patent: May 29, 2007

(54) METHOD OF FORMING PATTERNS

(75) Inventor: Yoshiharu Sasaki, Fujinomiya (JP)

(73) Assignee: Fujifilm Corporation, Tokyo (JP)

( * ) Notice: Subject to any disclaimer, the term of this patent is extended or adjusted under 35 U.S.C. 154(b) by 158 days.

(21) Appl. No.: 11/033,970

(22) Filed: Jan. 13, 2005

(65) Prior Publication Data

US 2005/0153567 A1 Jul. 14, 2005

(30) Foreign Application Priority Data

Jan. 13, 2004 (JP) .............................. 2004-005686

(51) Int. Cl.
*H01L 21/451* (2006.01)
(52) U.S. Cl. ...................... 438/736; 438/717; 438/950; 438/975; 430/5; 430/22
(58) Field of Classification Search ................ 438/671, 438/717, 736, 950, 975
See application file for complete search history.

(56) References Cited

U.S. PATENT DOCUMENTS 6,896,998 B2 * 5/2005 Mizukoshi .................... 430/22

2002/0012851 A1 * 1/2002 Coronel et al. ................ 430/5

FOREIGN PATENT DOCUMENTS

JP 6-169146 A 6/1994

* cited by examiner

*Primary Examiner*—Dung A. Le
(74) *Attorney, Agent, or Firm*—Sughrue Mion, PLLC

(57) ABSTRACT

In forming a mask pattern on a circuit board, a mask pattern of N-layer structure is formed in a region where the mechanical strength of the circuit board needs to be increased. N photosensitive layers are first stacked on a substrate so that they becomes lower in sensitivity from the first photosensitive layer toward the $N^{th}$ photosensitive layer. In the first photosensitive layer (bottom layer), a first pattern is formed and has the same shape as a predetermined pattern to be formed on the circuit board. In the $K^{th}$ photosensitive layer ($N \geq K \geq 2$), a $K^{th}$ pattern is formed so that the $K^{th}$ pattern is smaller than a $(K-1)^{st}$ pattern formed in the $(K-1)^{st}$ photosensitive layer and arranged inside the $(K-1)^{st}$ pattern.

5 Claims, 16 Drawing Sheets

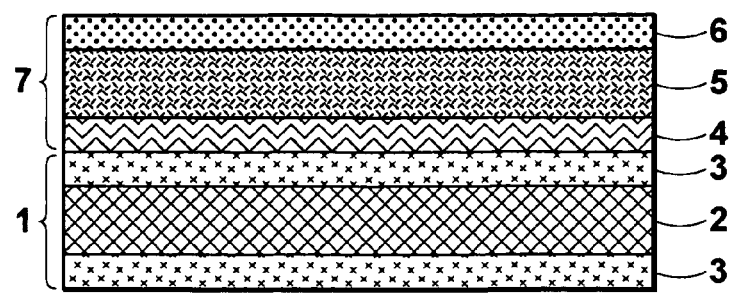
FIG.1
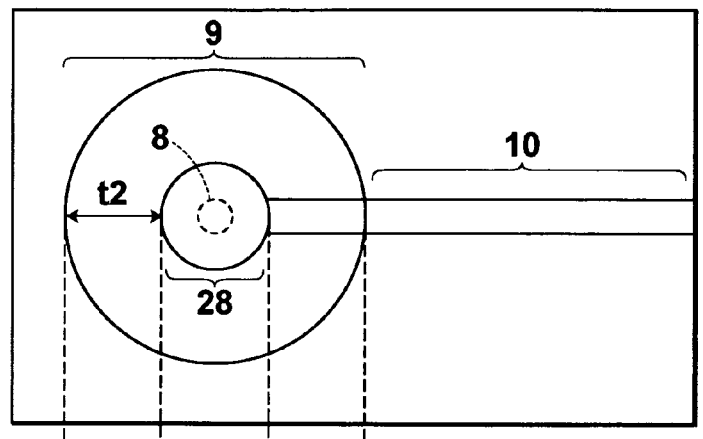
FIG.2A
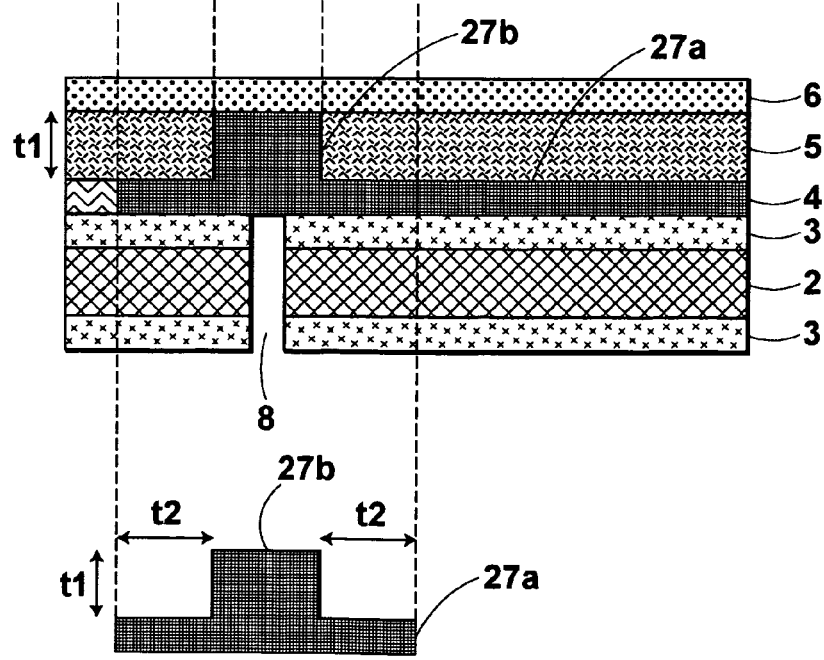
FIG.2B
FIG.2C

EXPOSED REGION

VERTICAL SCANNING DIRECTION
SINGLE CONSTANT-SPEED SCANNING (40 mm/s)

m COLUMN n ROW

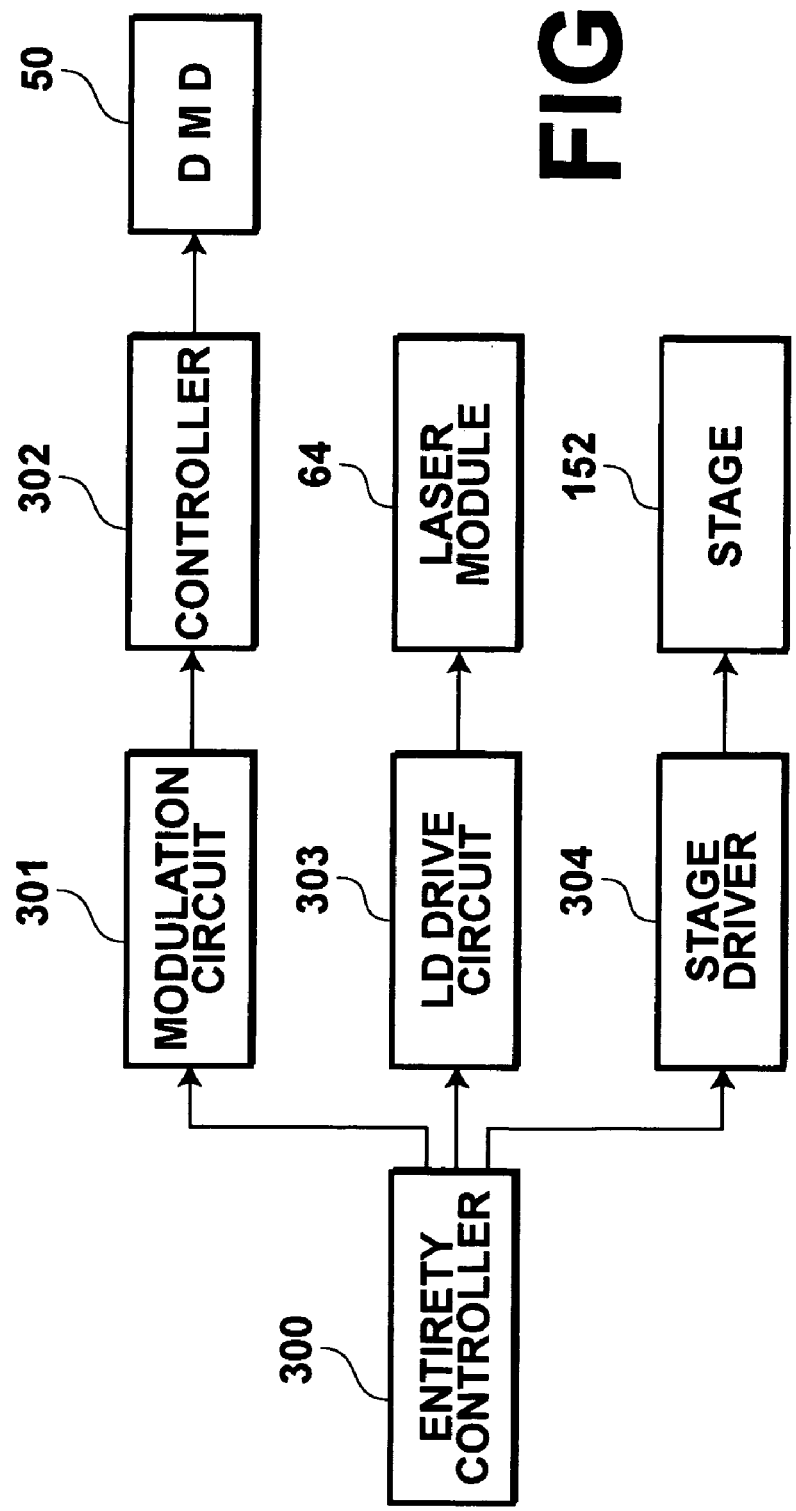

METHOD OF FORMING PATTERNS

BACKGROUND OF THE INVENTION

1. Field of the Invention

The present invention relates to a method suitable for forming wiring patterns on a substrate during a printed-circuit board fabrication step.

2. Description of the Related Art

Wiring patterns for a printed circuit board are typically formed as follows. First, a resist layer comprising a photosensitive material is formed on a conductive layer (e.g., a thin film of Cu) on which wiring patterns are to be formed. Then, the resist layer is exposed with a mask having patterns of the same shapes as the wiring patterns. After patterns of the same shapes as the wiring patterns (hereinafter referred to as resist patterns) are formed in the resist layer by development, the conductive layer is etched with the resist patterns as a mask. In this manner, the wiring patterns are formed on the conductive layer.

When fabricating a double-sided (or multilayer) printed circuit board, a through hole is first formed to connect wirings formed on both sides of a substrate. The above-described steps are then repeated on both sides of the substrate. Such steps are disclosed in Japanese Unexamined Patent Publication No. 6(1994)-169146, for example.

In the above-described circuit board fabrication step, when spraying a developer on the resist layer, or when spraying an etchant on the substrate where resist patterns are formed and then etching the conductive layer, there are cases where the resist pattern on the through hole in the substrate tears. The reason for this is that the resist pattern on the through hole becomes weaker in mechanical strength than the resist patterns formed on other portions of the substrate. If the resist layer is made thicker to increase the mechanical strength, it will block the flow of a developer in the development step and the flow of an etchant in the etching step. For this reason, there are cases where accurate resist patterns cannot be obtained.

SUMMARY OF THE INVENTION

The present invention has been developed in view of the circumstances described above. Accordingly, it is the primary object of the present invention to provide a pattern forming method that is capable of preventing a reduction in the yield rate due to damaged resist patterns, and also capable of accurately forming desired patterns.

To achieve this end and in accordance with the present invention, there is provided a method that forms an N-layer mask pattern in N photosensitive layers ($N \geq 2$) formed on a substrate by exposure and development. In the method of the present invention, the N photosensitive layers are first stacked on the substrate so that they becomes lower in sensitivity from the first photosensitive layer, which is the bottom layer of the N photosensitive layers, toward the $N^{th}$ photosensitive layer. Then, in the first photosensitive layer, a first pattern is formed that has the same shape as a predetermined pattern to be formed on the substrate. In the $K^{th}$ photosensitive layer ($N \geq K \geq 2$), a $K^{th}$ pattern is formed so that the $K^{th}$ pattern is smaller than a $(K-1)^{st}$ pattern formed in the $(K-1)^{st}$ photosensitive layer and arranged inside the $(K-1)^{st}$ pattern. In this manner, the N-layer mask pattern comprises the N photosensitive layers in which the first to $N^{th}$ patterns are formed.

In the method of the present invention, the $N^{th}$ pattern is preferably formed so that a distance (t2) from an edge of the $N^{th}$ pattern to an edge of the first pattern is greater than or equal to a total thickness (t1) of the N photosensitive layers excluding the thickness of the first photosensitive layer ($t2 \geq t1$).

An etching operation is performed by the N-layer mask pattern comprising N photosensitive layers in which the first to $N^{th}$ patterns are formed. In this manner, a pattern of the same shape as the first pattern is formed on a substrate.

In the method of the present invention, the aforementioned exposure may be performed by using a mask, but is preferably performed by employing an exposure system that exposes a surface by imaging a light beam modulated based on a value of each pixel data constituting binary image data, onto the surface. The aforementioned exposure may be performed so that light energy irradiated is increased in stages from an edge of the first pattern toward the center of the $N^{th}$ pattern. In order to increase light energy in stages, scanning may be performed a plurality of times with different amounts of light energy, or may be performed by an exposure system, described later, which is capable of irradiating light energies of different levels in a single scanning operation.

The pattern-forming method of the present invention employs an N-layer mask pattern as a mask for etching. Since the N-layer mask pattern has sufficient mechanical strength compared with a mask pattern of a single-layer structure, there is no possibility that the N-layer mask pattern will tear in the development and etching steps. In addition, the N-layer mask pattern becomes smaller in pattern size from the bottom layer toward the top layer so that a wide gap is formed between the underlying layer and the overlying layer, so there is no possibility that the flow of an etchant will be blocked in an etching step. Thus, in the etching step, a pattern of the same shape as the first pattern (bottom layer) of the N-layer-mask pattern can be formed on a substrate with a high degree of accuracy.

BRIEF DESCRIPTION OF THE DRAWINGS

The present invention will be described in further detail with reference to the accompanying drawings wherein:

FIG. 1 is a sectional view showing a substrate;

FIG. 2A is a top view showing a resist film stuck on the substrate shown in FIG. 1;

FIG. 2B is a sectional view of the resist film stuck on the substrate;

FIG. 2C is a side view showing a latent image formed near a through hole;

FIG. 24 is a block diagram showing the electrical construction of the exposure processing section.

DESCRIPTION OF THE PREFERRED EMBODIMENTS

Figure 3:
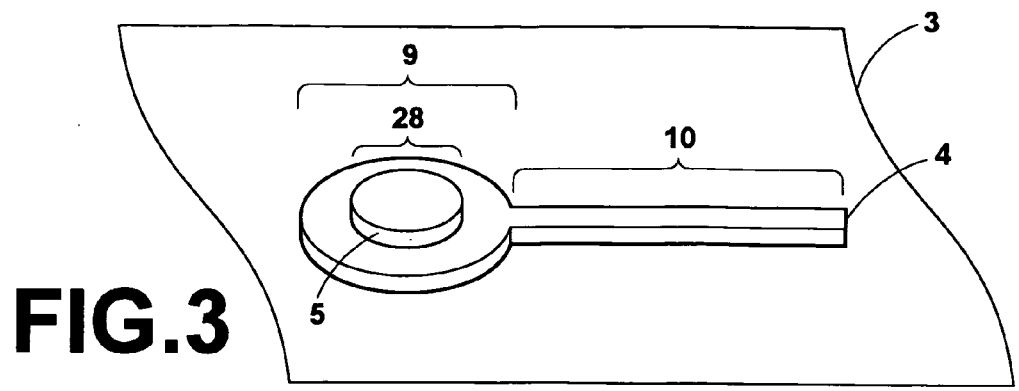
FIG. 3 is a perspective view showing resist patterns formed after exposure and development processes.

As a preferred embodiment of an image recording method of the present invention, a description will hereinafter be given of a pattern recording method used when recording wiring patterns on a substrate in a printed-circuit board fabrication step.

FIG. 1 shows a substrate 1 on which wiring patterns are to be formed. A resist film 7 has been stuck on the substrate 1.

As shown in FIG. 1, the substrate 1 comprises a glass epoxy substrate material 2, and thin copper films 3 stacked on both surfaces of the substrate material 2. The resist film 7 comprises a support layer 6, a thick-film low-photosensitive layer 5 (hereinafter referred to as a thick photosensitive layer 5) stacked on the support layer 6, and a thin-film highly-photosensitive layer 4 (hereinafter referred to as a thin photosensitive layer 4) stacked on the thick photosensitive layer 5. As shown in FIG. 1, the resist film 7 is stuck on the substrate 1 so that the thin photosensitive film 4 is contacted with the substrate 1.

The thin photosensitive layer 4 is constructed of a material that becomes sensitive to light when irradiated with an energy of 4 mJ/cm$^2$ or greater, and the thickness is about 5 to 10 μm. The thick photosensitive layer 5 is constructed of a material that becomes sensitive to light when irradiated with an energy of 40 mJ/cm$^2$ or greater, and the thickness is about 20 to 25 μm. The support layer 6 is formed from polyethylene terephthalate (PET) and the thickness is about 15 to 25 μm.

Note that instead of sticking the resist film 7 on the substrate 1, the thin photosensitive layer 4 and thick photosensitive layer 5 may be formed on the substrate 1 in the recited order.

FIGS. 2A to 2C show how mask patters for etching are to be formed in the thin photosensitive layer 4 and thick photosensitive layer 5. FIG. 2A shows a top view of the resist film 7 stuck on the substrate 1, FIG. 2B shows a sectional view of the resist film 7 and substrate 1, and FIG. 2C shows a latent image formed near a through hole by exposure.

In FIG. 2A, a peripheral region 9 around a through hole 8, and a line region 10, are first irradiated with a light energy of 4 mJ/cm$^2$ or greater and less than 40 mJ/cm$^2$ (4 mJ/cm$^2 \leq$ light energy $<$ 40 mJ/cm$^2$). With this irradiation, a latent image 27a is formed in a portion of the thin photosensitive layer 4 that corresponds to the peripheral region 9 and line region 10, as shown in FIG. 2B. Then, a central region 28 shown in FIG. 2A is irradiated with a light energy of 40 mJ/cm$^2$ or greater (light energy $\geq$ 40 mJ/cm$^2$). With this irradiation, a latent image 27b is formed in a portion of the thick photosensitive layer 5 that corresponds to the central region 28, as shown in FIG. 2B.

As shown in FIG. 2A, the central region 28 is inside the peripheral region 9 and is smaller in size than the peripheral region 9. More specifically, the distance t2 from the edge of the peripheral region 9 to the edge of the central portion 28 is greater than or equal to the thickness t1 of the thick photosensitive layer 5 (t2$\geq$t1). The regions 9 and 28, which are different in size, are irradiated with different light energies of different levels, whereby the latent images 27a, 27b are formed in the through-hole periphery and central portions of the photosensitive layers 4, 5. For example, if the peripheral region 9 is a circular region having a diameter of 500 μm, the central portion 28 is a concentric, circular region having a diameter of 450 to 460 μm.

In a development step, as shown in FIG. 3, a resist pattern corresponding to the line region 10 is formed only in the thin photosensitive layer 4. Also, a two-layer resist pattern corresponding to the central and peripheral portions 28, 9 is formed in both the thin photosensitive layer 4 and the thick photosensitive layer 5. That is, an underlying resist pattern corresponding to the peripheral portion 9 is formed in the thin photosensitive layer 4, and an overlying resist pattern corresponding to the central portion 28 is formed in the thick photosensitive layer 5. In this manner, a thick resist pattern capable of resisting the spraying pressure of a developer and spraying pressure of an etchant is formed in the through-hole peripheral region, and a thin resist pattern suitable for etching the thin copper film 3 is formed in the line region 10.

Next, the thin copper film 3 is etched with the resist patterns of FIG. 3 as a mask. In the structure shown in FIG. 3, the resist pattern in the through-hole peripheral region has sufficient mechanical strength, as described above. Therefore, there is no possibility that the resist pattern will tear. Finally, resist layers are removed, and wiring patterns formed from the thin cupper film are obtained.

In conjunction with FIGS. 4 and 5, a description will be given of the reason why the central region 28 is made smaller than the peripheral region 9, that is, the reason why the resist pattern 27b in the thick photosensitive layer 5 is made smaller than the resist pattern 27a in the thin photosensitive layer 4.

The problem of a tear in the resist pattern in the etching step can also be overcome by forming a resist pattern of the same size in the thick photosensitive layer 5 so that it is overlaid on the resist pattern 27a formed in the thin photosensitive layer 4. If an area where a thick resist pattern is formed is minimized and a resist pattern for the line region is formed in one layer in a conventional manner, accuracy of patterning can be assured to some degree.

Figure 4:
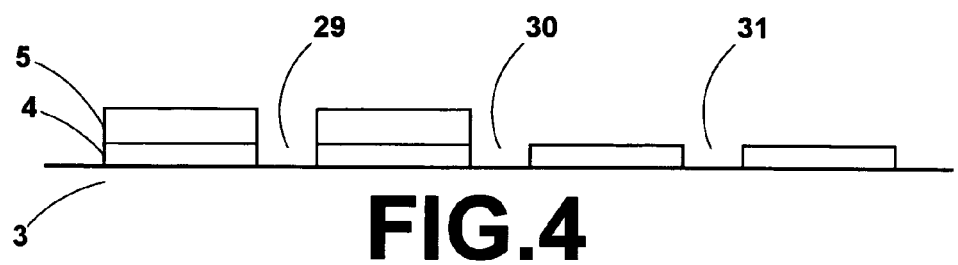
FIGS. 4 and 5 are side views used to explain the reason why the overlying layer of a resist pattern is made smaller than the underlying layer.

However, in the above-described case, resist patterns of a two-layer structure and resist patterns of a one-layer structure are formed together on the substrate, as shown in FIG. 4. As a result, the structures of the exposed portions of the thin copper film 3 by etching are three kinds of structures 29, 30, and 31, as shown in FIG. 4.

The first structure 29 is formed by two adjacent resist patterns of a two-layer structure. In this structure, when the space between two adjacent patterns is narrow, it is difficult for an etchant to flow through the narrow space in the etching step, and consequently, there are cases where the space formed on the thin copper film 3 becomes narrower than a predetermined width. Also, in the development step before the etching step, it becomes difficult for a developer to flow through the space between resist patterns after the resist layer is removed to a depth of some magnitude or greater, and consequently, there are cases where development becomes insufficient. As with the above case, a satisfactory space cannot be formed on the thin copper film 3.

The second structure 30 is formed by a resist pattern of a two-layer structure and a resist pattern of a one-layer structure. In this structure, the flow of an etchant and the flow of a developer are good compared with the first structure 29, but the same problem as the first structure 29 will arise.

The third structure 31 is formed between two adjacent resist patterns of a one-layer structure. In this structure, the flow of a developer in the developing step and the flow of an etchant in the etching step encounter no problems, and a space with a predetermined width is formed on the thin copper layer 3.

Thus, if an etching process is performed on a substrate on which resist patterns of a two-layer structure and resist patterns of a one-layer structure are formed together, satisfactory patterns will be formed on part of the thin copper film, but unsatisfactory patterns will be formed on the remaining parts.

Figure 5:
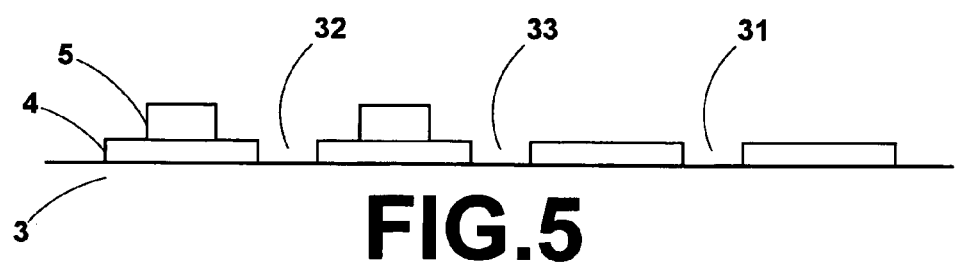

However, in a resist pattern of a two-layer structure, if the overlying pattern in the thick photosensitive layer 5 is made smaller than the underlying pattern in the thin photosensitive layer 4, the first structure 32 between two adjacent resist patterns of the two-layer structure becomes the third structure 31 between two adjacent resist patterns of a one-layer structure, as shown in FIG. 5. Similarly, the second structure 32 between a resist pattern of the two-layer structure and a resist pattern of the one-layer structure becomes the third structure 31 between two adjacent resist patterns of the one-layer structure. For this reason, in the structures 32, 33, and 31, the flow of an etchant and the flow of a developer encounter no problems. Therefore, in each of the structures 32, 33, and 31, a space with a predetermined width can be formed on the thin copper film 3 in the etching step.

The foregoing description is the reason why the resist pattern 27b in the thick photosensitive layer 5 is made smaller than the resist pattern 27a in the thin photosensitive layer 4. Therefore, the resist pattern 27b in the thick photosensitive layer 5 must be formed inside to a degree that it does not block the flow of a developer and the flow of an etchant. Typically, if a resist pattern with a width greater than or equal to the thickness of the thick photosensitive layer 5 is formed around a resist pattern of a two-layer structure, as described with reference to FIG. 2C, the flow of a liquid can be prevented from being blocked.

While it has been described that the two-layer resist pattern comprising the thick photosensitive layer 5 and thin photosensitive layer 4 is formed around the through hole 8, the number of layers in the resist pattern does not always need to be two layers, but may be N layers (N>2). For example, a resist pattern of a four-layer structure will hereinafter be described.

Figure 6:
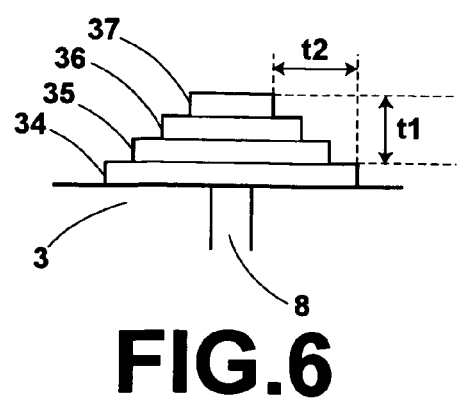
FIG. 6 is a side view showing an example of a resist pattern of N-layer structure.

Referring to FIG. 6, there is shown a resist pattern of a four-layer structure formed around the through-hole 8 of the thin copper layer 3. The resist pattern comprises a first layer 34, a second layer 35, a third layer 36, and a fourth layer 37, which are formed from materials different in sensitivity. The sensitivity of the resist pattern is gradually made lower from the first layer 34 toward the fourth layer 37. Also, the layers of the resist pattern become smaller from the first layer 34 toward the fourth layer 37. The distance t2 from the edge of the fourth layer (top layer) 37 to the edge of the first layer (bottom layer) 34 is preferably greater than or equal to the total thickness t1 of the layers 35, 36, and 37. That is, the resist pattern of the four-layer structure preferably has a relation of $t2 \geq t1$.

In the resist pattern of the N-layer structure shown in FIG. 6, as with the aforementioned resist pattern of the two-layer structure, there is no possibility that the flow of a developer and flow of an etchant will be blocked at the space between patterns. For this reason, thin copper film patterns with predetermined space widths can be accurately formed in the etching step.

Also, in the resist pattern of a two-layer structure, when the thick photosensitive layer 5 is made much smaller in size than the thin photosensitive layer 4, an area where the thin photosensitive layer 4 is formed in a single layer is increased and therefore there are cases where sufficient mechanical strength cannot be obtained at the portion of the one-layer structure. In the resist pattern of the four-layer structure shown in FIG. 6, an area where the first layer 34 is formed in a single layer is relatively small, so high mechanical strength can be obtained compared with a resist pattern of the two-layer structure.

Next, a description will be given of how the above-described resist pattern of the two-layer or an N-layer ($N \geq 3$) structure is to be formed. As previously described, the above-described resist pattern can be formed by irradiating light energy in stages to areas where patterns are to be formed, according to the sensitivity of each of the layers constituting the resist pattern. For instance, in the example shown in FIGS. 1 to 5, as described above, the peripheral region 9 and line region 10 are irradiated with a light energy of 4 mJ/cm$^2$ or greater and less than 40 mJ/cm$^2$ (4 mJ/cm$^2 \leq$ light energy < 40 mJ/cm$^2$), and the central portion 28 is irradiated with a light energy of 40 mJ/cm$^2$ or greater (40 mJ/cm$^2 \leq$ light energy). Similarly, when forming the resist pattern shown in FIG. 6, the peripheral region around the through hole 8 is irradiated with light energy increased in stages from the edge of the peripheral region 9 to the center.

However, in exposing the above-described resist patterns, the exposure operation must be performed twice, using two kinds of masks, a first mask for exposing the peripheral region 9 and line region 10 shown in FIG. 2A and a second mask for exposing the central region 28. The time needed for the two exposure operations is doubled, compared with the case where a resist pattern of a one-layer structure is exposed. Also, in the case of a resist pattern of N-layer structure, the time needed is N times the time needed for exposure of a one-layer structure.

Furthermore, when exposure is performed a plurality of times, there are cases where patterns in layers are not aligned with each other. When a resist pattern in the thick photosensitive layer 5 is not aligned with a resist pattern formed in the thin photosensitive layer 4, there is a possibility that the distance t2 shown in FIG. 2C will be smaller than the film thickness t1. When positional misalignment occurs, there is a possibility that the flow of an etchant will be blocked. Also, when positional misalignment occurs in the case of a resist pattern of an N-layer structure, the structure of the resist pattern becomes complex, and consequently, there is a possibility that the flow of an etchant will be blocked.

Thus, resist patterns of a two-layer or an N-layer structure can be formed by exposure through masks, but it is not necessarily easy to form resist patterns of the N-layer structure by exposure through masks.

As an exposure method employing no mask, there is a method employing an exposure system, disclosed in Japanese Unexamined Patent Publication No. 2003-345030, which forms patterns directly on an exposure surface by laser light modulated with a spatial modulator. This system includes a digital micro mirror device (hereinafter referred to as "DMD" (Texas Instruments)), in which a great number (e.g., 1024×768) of micro mirrors that each constitute 1 pixel are arrayed in the form of a lattice, as a spatial modulator. In this system, the direction of each micro mirror is individually controlled based on a value of each pixel data constituting binary image data, and laser light incident on each micro mirror is reflected in one of two directions. The laser light reflected in one direction of the two directions is passed through an optical system and recorded on a photosensitive material. That is, laser light reflected by micro mirrors corresponding to pixels having a value of 1 is imaged onto the photosensitive material. In this manner, the photosensitive material can be exposed according to patterns of shapes represented by binary image data.

However, even such an exposure system has to perform exposure twice in order to irradiate light energies of different levels to the peripheral region 9, the line region 10 and to the central region 28, shown in FIG. 2A. That is, the substrate must be scanned twice with laser light. In forming a resist pattern of an N-layer structure, the substrate must be scanned N times. For this reason, the method employing the above-described exposure system can save costs associated with masks, but still takes a considerable time compared with the case where a pattern of a one-layer structure is formed.

Hence, the inventors have developed a pattern recording system hereinafter described, and formed the aforementioned resist pattern by exposing the thin photosensitive layer 4 and thick photosensitive layer 5 with this recording system. As described later, this system is capable of forming a resist pattern of an N-layer structure in nearly the same time as the case where a pattern of a one-layer structure is formed.

Figure 7:
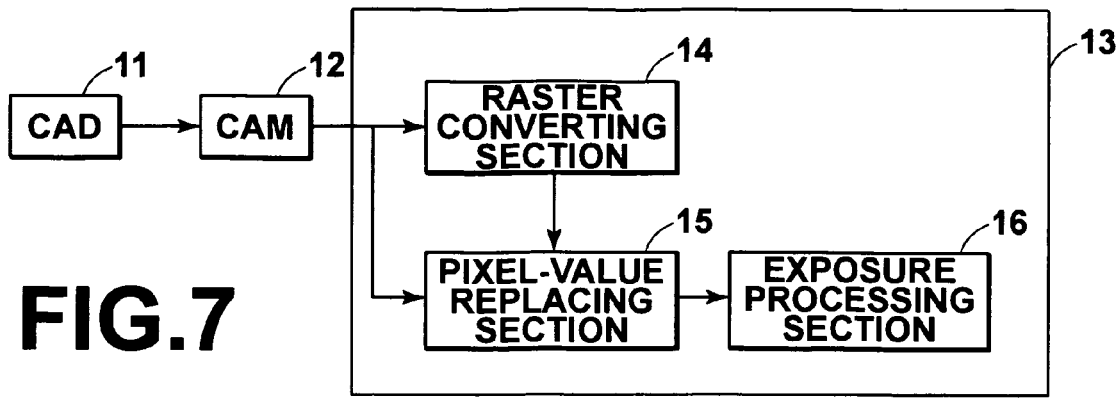
FIG. 7 is a block diagram showing a pattern recording system.

FIG. 7 shows a pattern recording system used in recording resist patterns. This pattern recording system is usually made up of a computer-aided design (CAD) system 11 and computer-aided manufacturing (CAM) system 12 used for designing patterns on a substrate, and an image recorder 13 for recording patterns on a substrate, on which a resist film is stuck.

The CAD system 11 and CAM system 12 can be obtained by installing CAD and CAM software programs into a personal computer (PC), etc. The CAM system 12 is used to output dimensions of patterns, which are to be formed on a substrate, as vector data. The vector data output from the CAM system 12 is input to the image recorder 13.

The image recorder 13 is equipped with a raster converting section (image-data acquiring section) 14, a pixel-value replacing section 15, and an exposure processing section 16. The raster converting section (image-data acquiring section) 14 converts the vector data input from the CAM system 12, into binary image data. The pixel-value replacing section 15 performs a pixel-value replacement process (to be described later) on the acquired binary image data. The exposure processing section 16 modulates laser light according to the pixel-value replaced binary image data and outputs an exposure beam.

Figure 8:
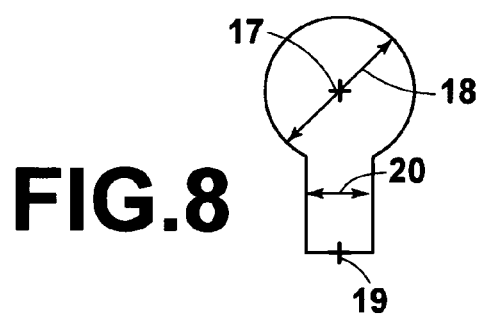
FIG. 8 is a diagram used to explain the vector data that is output from the CAM system shown in FIG. 7.

FIG. 8 shows the vector data that is input from the CAM system 12 to the image recorder 13. As shown in the figure, vector data, such as coordinate data representing the position 17 of the through hole 8, data representing the diameter 18 of the land of the through-hole peripheral portion 9, coordinate data representing the start or end point 19 of the line region 10, and data representing a line width 20, are input from the CAM system 12 to the image recorder 13. In this embodiment, the diameter 18 of the land of the through-hole peripheral portion 9 is 0.1 to 6 mm and the line width 20 is 20 μm. The raster converting section 14 uses these data to generate binary image data.

Figure 9:
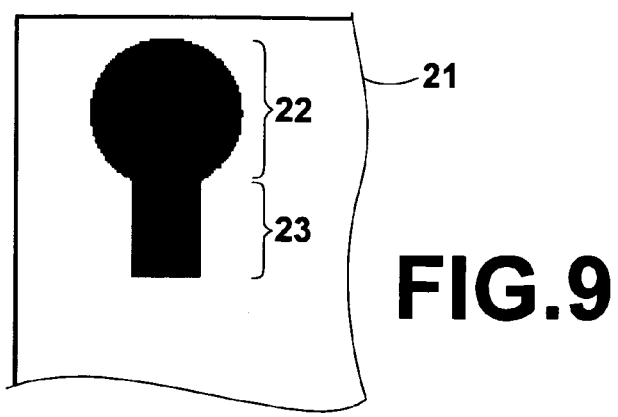
FIG. 9 is a diagram used to explain the binary image data that is output from the raster converting section shown in FIG. 7.

FIG. 9 shows binary image data 21 output by the raster converting section 14. The binary image data 21 comprises a first pattern image 22 to be recorded on the through-hole peripheral portion 9 and a second pattern image 23 to be recorded on the line region 10. When the resist film 7 is negative, the raster converting section 14 outputs an image that comprises 1-pixel data (which have a value of 1) representing patterns to be recorded and 0-pixel data (which have a value of 0) representing an area other than patterns to be recorded. Such a case is shown in FIG. 9, in which 1-pixel data are shown as black and 0-pixel data are shown as white.

Conversely, when the resist film 7 is positive, the raster converting section 14 outputs an image that comprises 0-pixel data representing patterns to be recorded and 1-pixel data representing an area other than patterns to be recorded. The raster converting section 14 is preferably constructed so that one of the two methods of conversion is selected by an input signal, depending on the type of resist film used.

The binary image data 21 is processed in the pixel-value replacing section 15. Before explaining in detail the process that is performed by the pixel-value replacing section 15, a description will be given of the distribution of energy irradiated to the substrate when laser light strikes the substrate.

Figure 10:
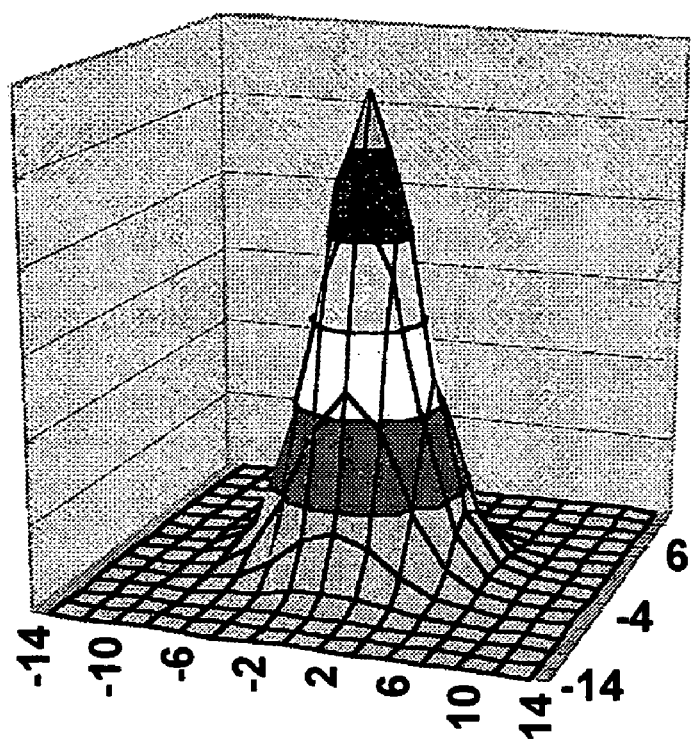
FIG. 10 is a diagram showing energy distribution for laser light.

FIG. 10 shows energy distribution for laser light irradiated to one point on the substrate. As shown in the figure, it is known that the energy distribution becomes a Gaussian distribution.

Figure 11:
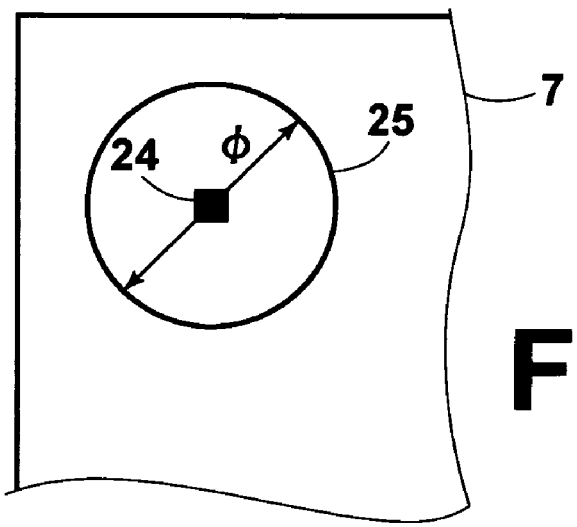
FIG. 11 is a diagram showing the relationship between the irradiated position and spot size of laser light.

FIG. 11 shows the relationship between an area equivalent to one pixel when an image is recorded on the substrate, and the spot size of laser light. The area of one pixel on the substrate is represented by a first area 24. In this embodiment, the size of the first area 24 is 2 μm×2 μm. As shown in FIG. 11, laser light is irradiated to a second area 25 wider than the first area 24. In this embodiment, the spot size φ of laser light is 12 μm in diameter. The spot size φ is defined as an area where, when the energy at the center of the laser spot is 1, an energy of $1/e^2$ or greater is irradiated.

Figure 12A:
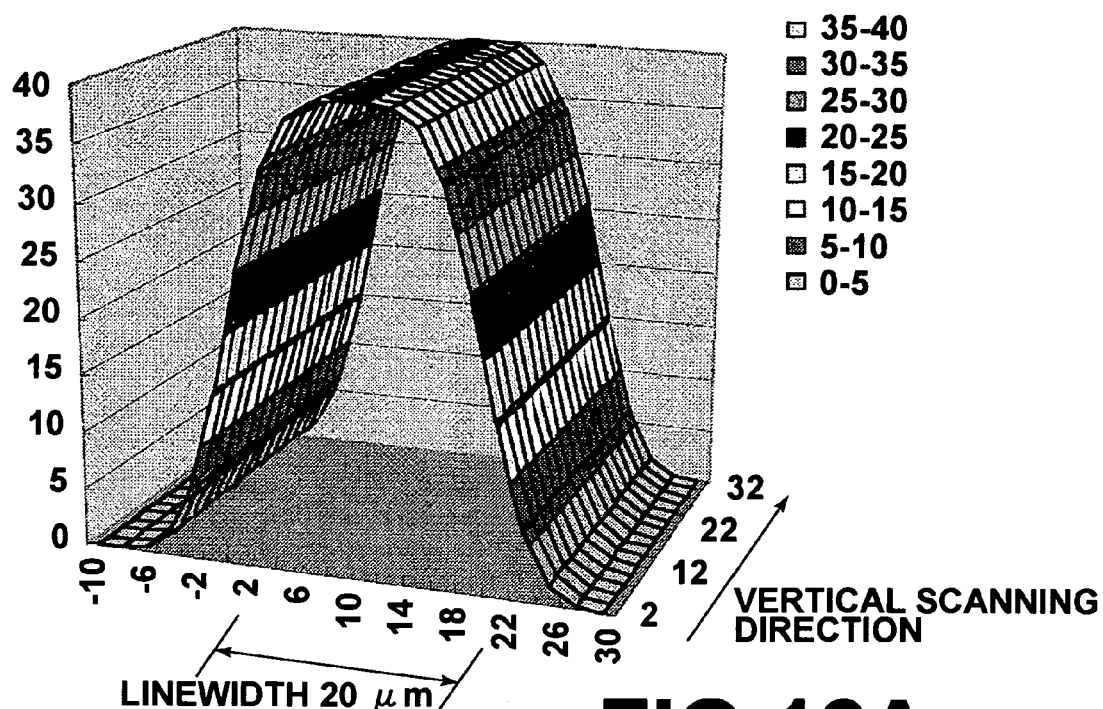
FIG. 12A is a perspective view showing the distribution of energy irradiated to the substrate (in which no pixel-value replacement is performed)
Figure 12B:
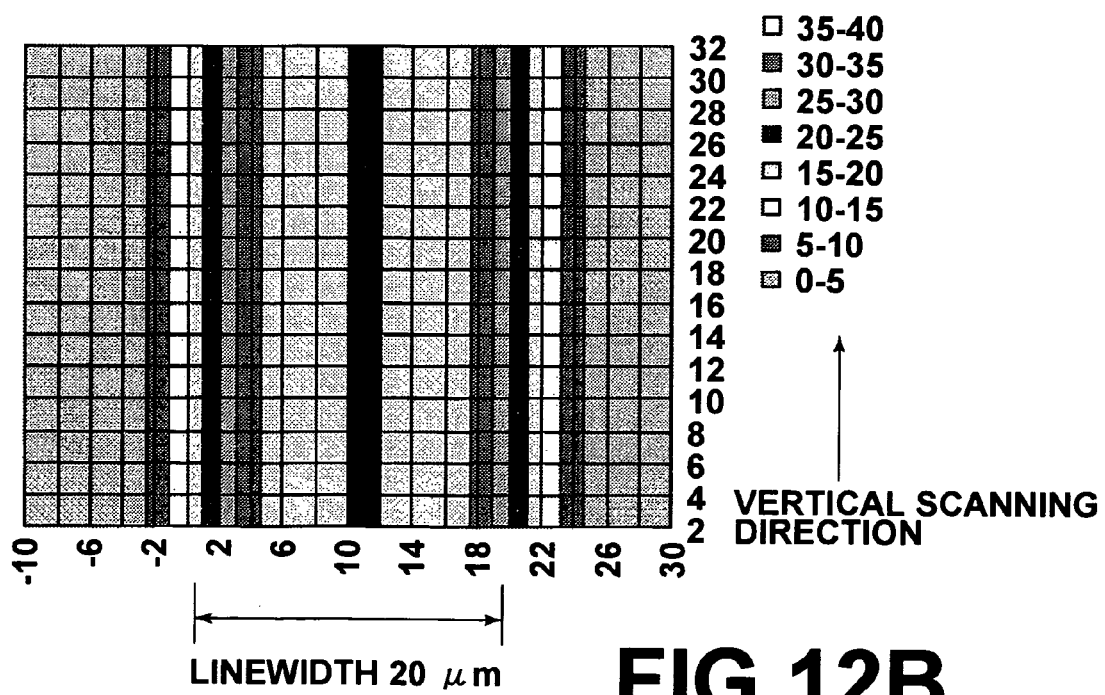
FIG. 12B is a plan view showing the distribution of energy irradiated to the substrate (in which no pixel-value replacement is performed)

For comparison, a conventional recording method will be described. FIGS. 12A and 12B show energy distributions obtained when exposure by laser light with a predetermined intensity is performed, using the pattern image 23 of the line region 10 of the binary image data 21 shown in FIG. 9. A perspective view of the energy distribution is shown in FIG. 12A and a plan view thereof is shown in FIG. 12B. As shown in FIG. 12A, the energy irradiated to the line region 10 is 40 mJ/cm$^2$. This is equivalent to the energy required to expose the thick photosensitive layer 5. Therefore, in the example shown in FIGS. 12A and 12B, a thick resist pattern is formed in the line region 10 as well as the peripheral portion 9.

Next, the process in the pixel-value replacing section 15 will be described. In order for only the thin photosensitive layer 4 to be exposed near the edges of the line region 10 and peripheral region 9, the pixel-value replacing section 15 replaces 1-pixel data with 0-pixel data. In other words, in the line region 10, the number of 1-pixel data is reduced. If the number of 1-pixel data is reduced, the amount of energy to be irradiated to the resist film is reduced. Therefore, even when optical scanning is performed with laser light having the same intensity as the example shown in FIGS. 12A and 12B, the thick photosensitive layer 5 is not exposed near the edges of the line region 10 and peripheral region 9. For the pixel data constituting the central region 28, the pixel-value replacing section 15 does not perform pixel-value replacement.

Figure 13:
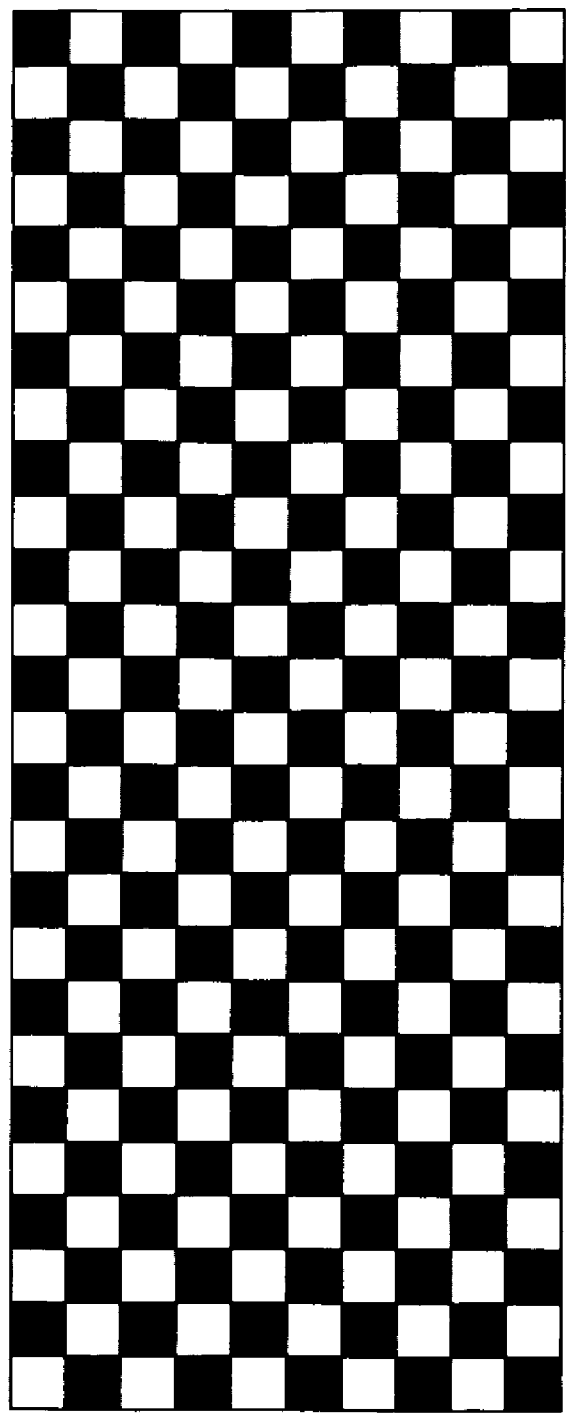
FIG. 13 is a plan view showing binary image data obtained when pixel-value replacement is performed so that the number of 1-pixel data is reduced to half.

For example, FIG. 13 shows a pattern image obtained when pixel-value replacement is performed on the pattern image 23 of the line region of the binary image data 21 of FIG. 9 so that the number of 1-pixel data is reduced to half. That is, pixel-value replacement is performed so that a pattern image of 1-pixel data and 0-pixel data alternately arranged is obtained.

Figure 14A:
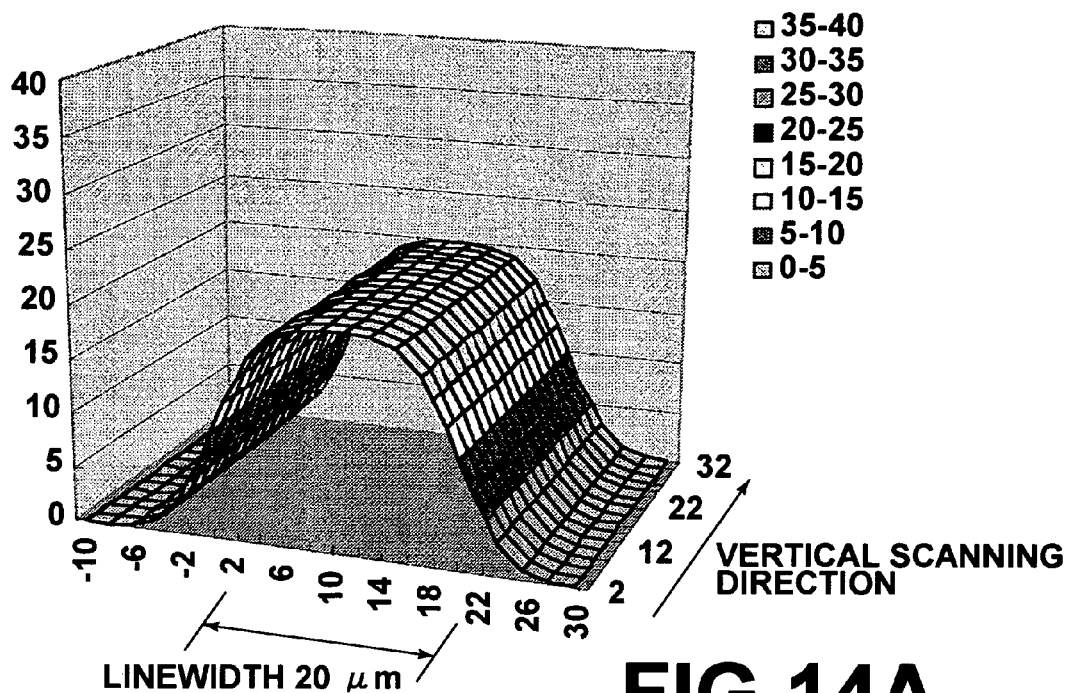
FIG. 14A is a perspective view showing the distribution of energy irradiated to the substrate when the pattern of the binary image data shown in FIG. 13 is recorded.
Figure 14B:
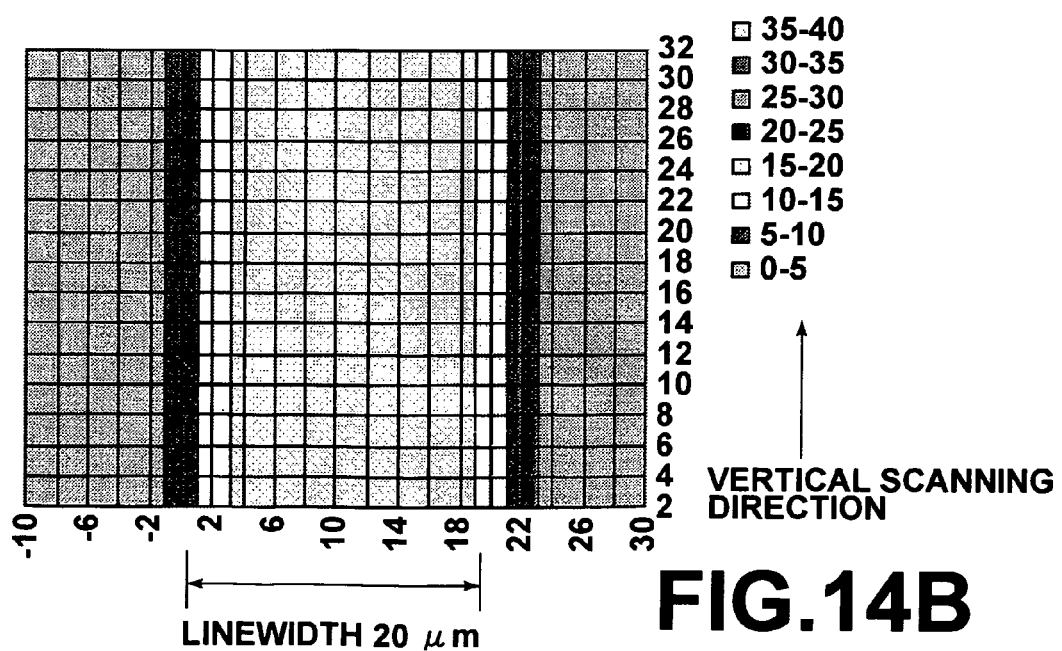
FIG. 14B is a plan view showing the distribution of energy irradiated to the substrate when the pattern of the binary image data shown in FIG. 13 is recorded.

FIGS. 14A and 14B show energy distribution obtained when the pattern image shown in FIG. 13 is recorded. A perspective view of the energy distribution is shown in FIG. 14A and a plan view thereof is shown in FIG. 14B. As shown in the figures, in this example, the energy irradiated to the line region 10 is 20 mJ/cm$^2$, which is the half of the case where no pixel-value replacement is performed. With this energy amount, a latent image is formed in the thin photosensitive layer 4, but no latent image is formed in the thick photosensitive layer 5.

Note that as long as the energy irradiated to the line region is 4 mJ/cm$^2$ or greater, pixel-value replacement may be performed so that the number of 1-pixel data is further reduced to less than ½.

As previously described in FIG. 7, in this embodiment, vector data is input from the CAM system 12 to the pixel-value replacing section 15. In dependence on the input vector data, the pixel-value replacing section 15 judges how a replacement process is performed on each area of the binary image data 21, or judges that a replacement process is not performed.

For instance, if the coordinate data representing the position 17 of the through hole shown in FIG. 8 is input, the pixel-value replacing section 15 judges that the pattern of the periphery of the position 17 represented by the coordinate data is the pattern of the through-hole peripheral portion. In this case, the pixel-value replacing section 15 recognizes the peripheral region 9 of FIG. 2A, based on data representing the diameter 18 of the land region 18. The pixel-value replacing section 15 further recognizes the central portion 28, based on the value t2 previously set. And the pixel-value replacing section 15 performs no pixel-value replacement on the pixel data constituting the central region 28, and performs pixel-value replacement on the remaining portion of the peripheral region 9 excluding the central region 28. Also, if data for the linewidth 20 shown in FIG. 8 is input, the pixel-value replacing section 15 judges that the pattern of the periphery is a pattern representing the line region 10, and performs replacement of pixel values.

Figure 15:
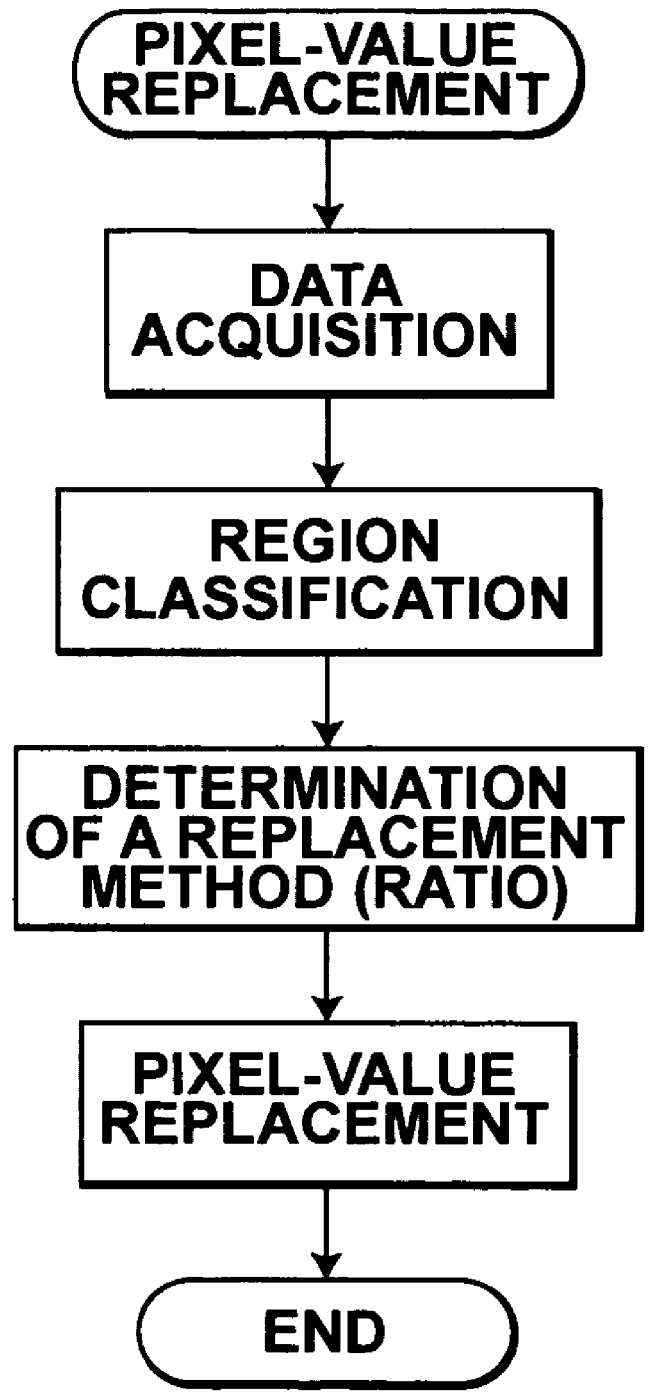
FIG. 15 is a flowchart showing how a replacement process is performed by the pixel-value replacing section shown in FIG. 7.

FIG. 15 shows how a replacement process is performed by the pixel-value replacing section 15. The pixel-value replacing section 15 first acquires binary image data 21 from the raster converting section 14 and vector data from the CAM system 12. Next, in dependence on the vector data, the pixel-value replacing section 15 classifies the regions contained in the binary image data 21, as shown in FIG. 2A. That is, the regions are classified as the through-hole peripheral region 9, central region 28, line region 10, and a region on which no data is recorded. The pixel-value replacing section 15 then judges whether pixel-value replacement is performed for each of the classified regions. When performing pixel-value replacement, the pixel-value replacing section 15 decides the number of pixel data to be replaced. Thereafter, the pixel-value replacing section 15 performs pixel-value replacement on each of the regions and generates binary image data in which a different replacement process is performed on each region.

Figure 16:
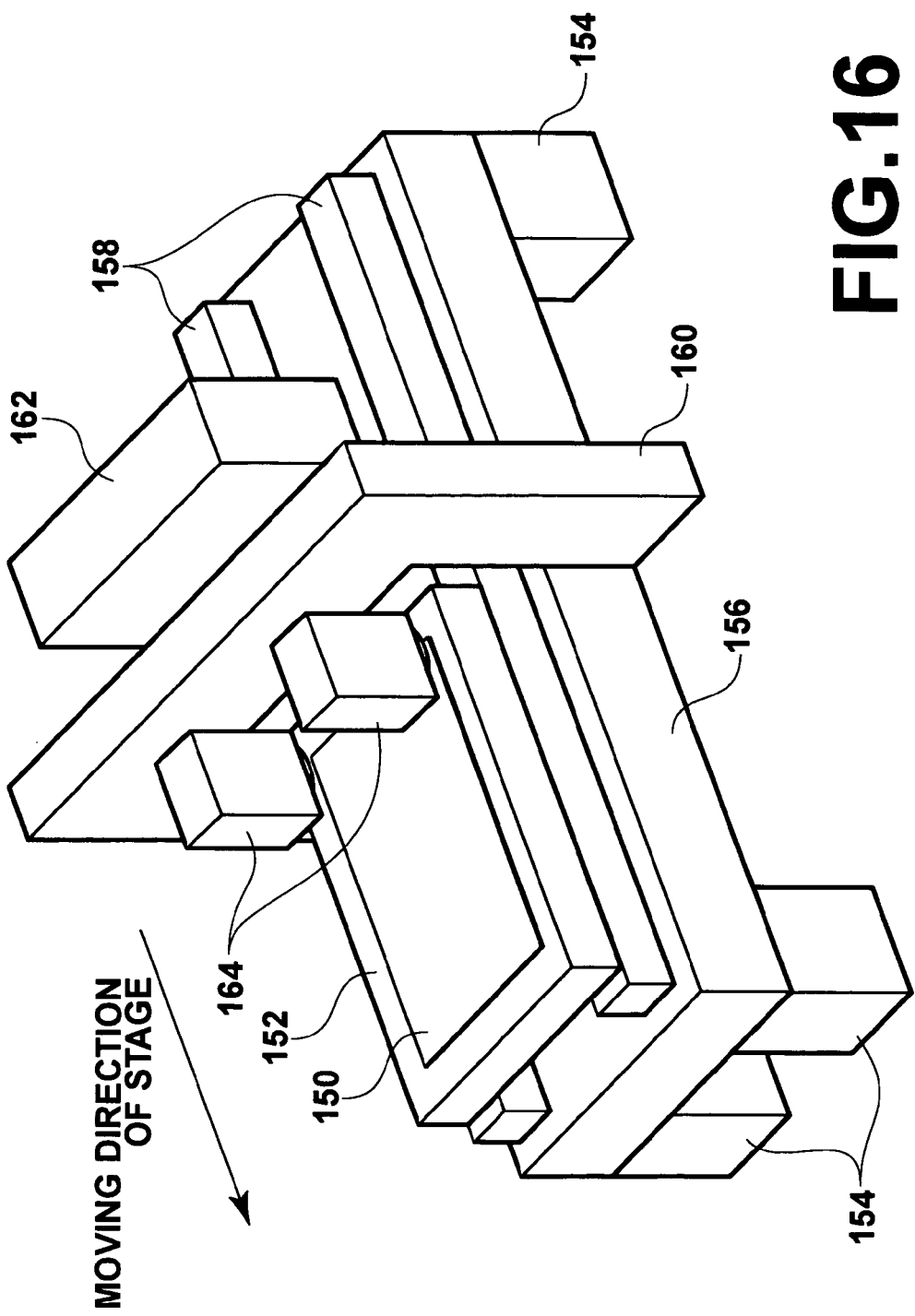
FIG. 16 is a diagram showing binary image data employed in forming a resist pattern of two-layer structure.

FIG. 16 shows binary image data employed in forming the resist pattern of two-layer structure shown in FIG. 3. In the binary image data, different replacement processes are performed on different regions, respectively. As shown in FIG. 16, pixel-value replacement is not performed on the central region 28, so the values of pixel data representing the central region 28 are all 1. In the figure, 1-pixel data is shown as black and 0-pixel data is shown as white. In the peripheral region 9 excluding the central region 28, pixel-value replacement is performed so that the number of 1-pixel data is reduced to ½. Similarly, in the line region 10, the pixel-value replacement is performed so that the number of 1-pixel data is reduced to ½.

Also, when forming the resist pattern of four-layer structure shown in FIG. 6, the ratio at which 1-pixel data are replaced with 0-pixel data is reduced in stages from the edge of the peripheral region 9 to the central region 28. For example, in the first layer (bottom layer) 34, ¾ of 1-pixel data are replaced with 0-pixel data. In the second layer 35, ½ of 1-pixel data are replaced with 0-pixel data. In the third layer 36, ¼ of 1-pixel data are replaced with 0-pixel data. In the fourth layer (top layer) 37, no pixel-value replacement is performed.

If pixel-value replacement is previously performed as described above, the processed binary image data is input to the exposure processing section 16 of FIG. 7, and optical scanning is performed by laser light modulated according to the processed binary image data. At this time, the light energy irradiated from the edge (bottom layer 34) of the peripheral region 9 to the central portion (top layer 37) is increased in stages, so exposure needed to form a resist pattern of N-layer structure can be performed with a single optical scanning operation.

Figure 17:
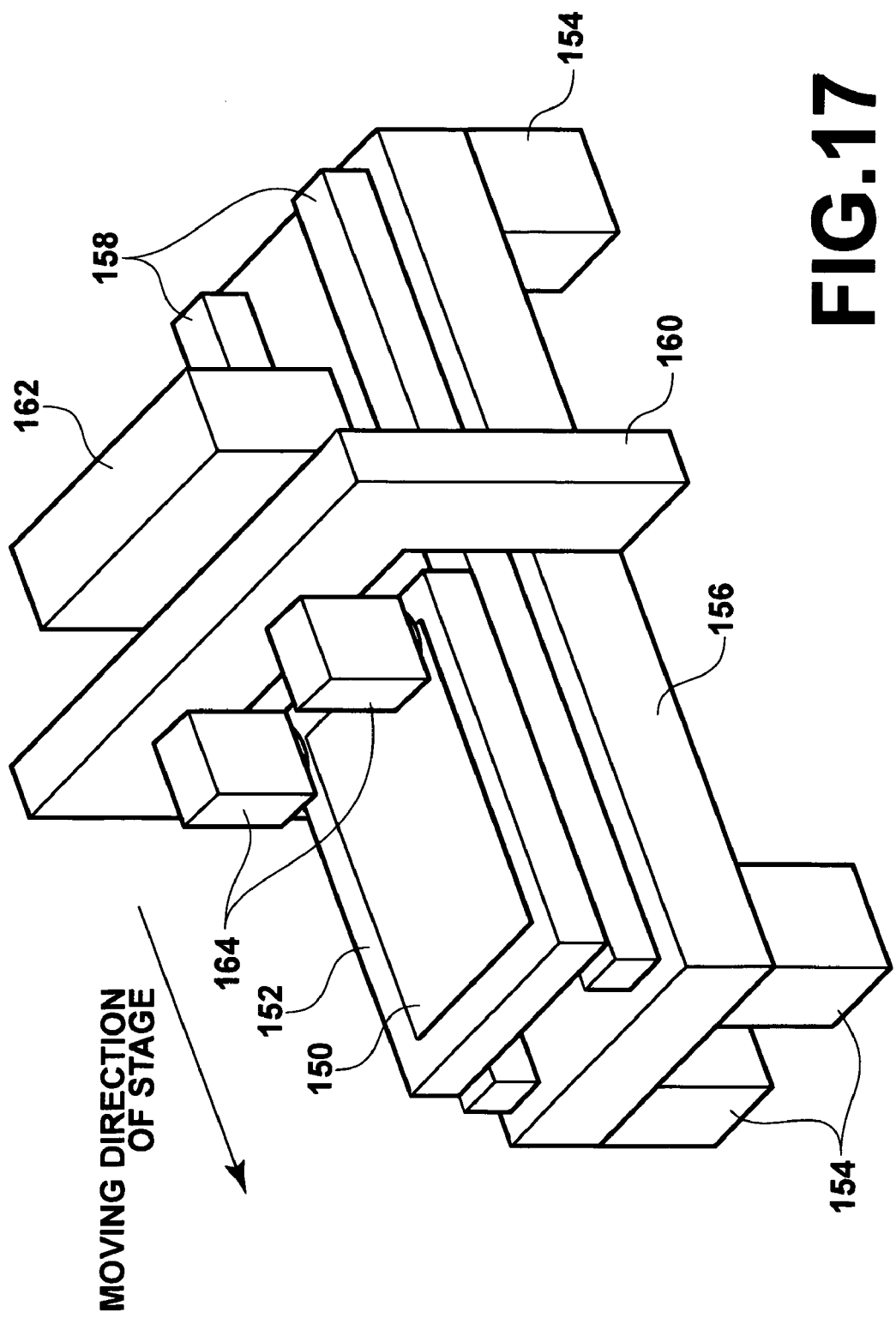
FIG. 17 is a perspective view of the exposure processing section shown in FIG. 7.

Next, a description will be given of the exposure processing section 16. Initially, the construction of the exposure processing section 16 will be described. The exposure processing section 16 is equipped with a movable stage 152 that attracts and holds a sheet-shaped substrate 150 on the surface thereof, as shown in FIG. 17. Two guides 158 extending along the moving direction of the stage 152 are mounted on a mounting table 156, which is in turn supported by four leg portions 154. The stage 152 is arranged so the longitudinal direction thereof becomes parallel to the moving direction of the stage 152 and is also supported by the guides 158 so it can reciprocate. Note that the exposure processing section 16 is provided with a stage driver (not shown) that drives the stage 152 (vertical scanning means) along the guides 158.

A U-shaped gate 160 is provided on the central portion of the mounting table 156 so it extends across the moving path of the stage 152. The end portions of the L-shaped gate 160 are secured to both side surfaces of the mounting table 156. A scanner 162 is disposed on one side across the gate 160, and a plurality (e.g., two) of sensors 164 are disposed on the other side. The scanner 162 and sensors 164 are attached to the gate 160 so they are positioned over the moving path of the stage 152. Note that the scanner 162 and sensors 164 are connected to a controller (not shown) that controls them.

Figure 18:
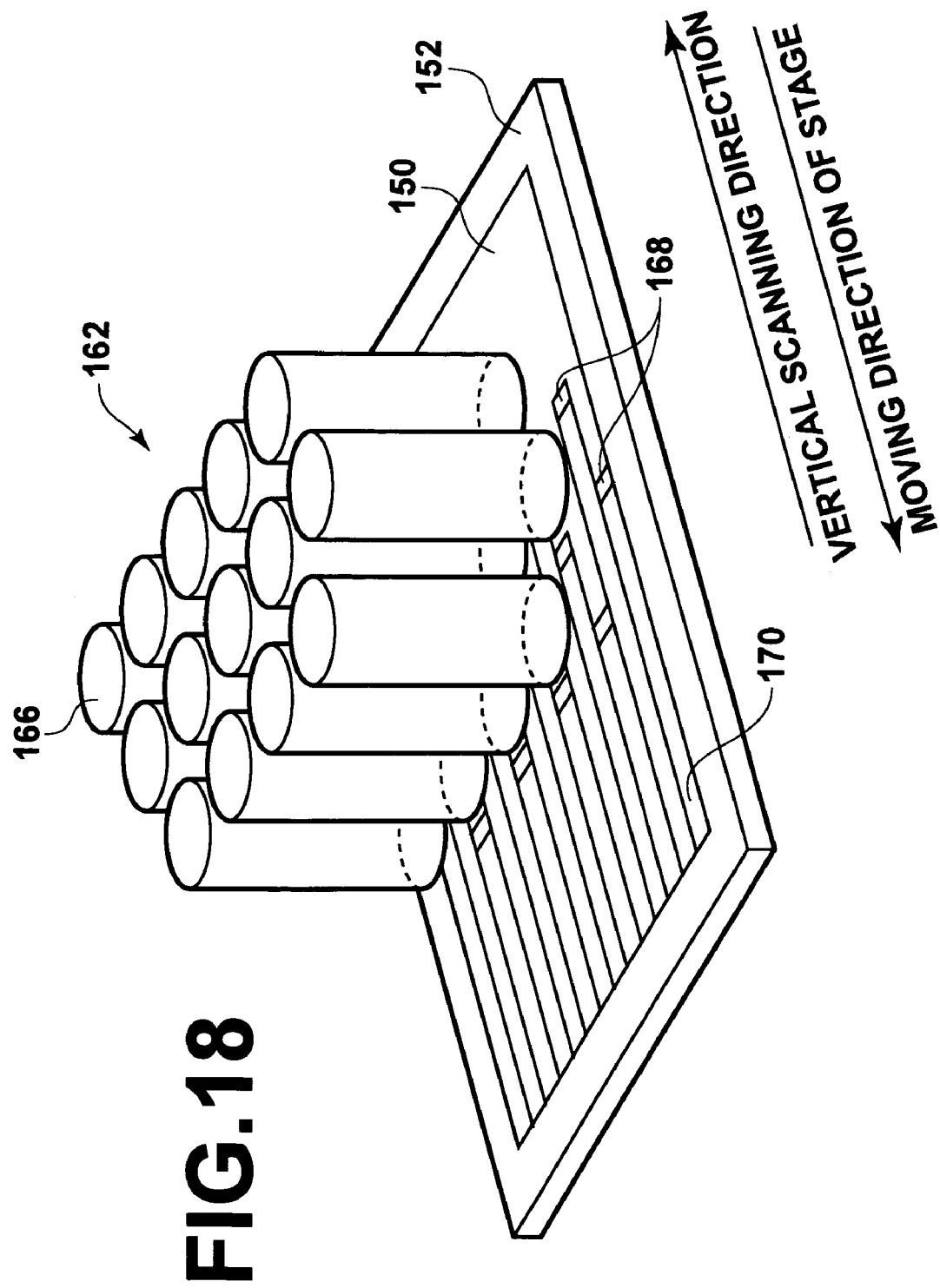
FIG. 18 is a perspective view showing the scanner of the exposure processing section.
Figure 19A:
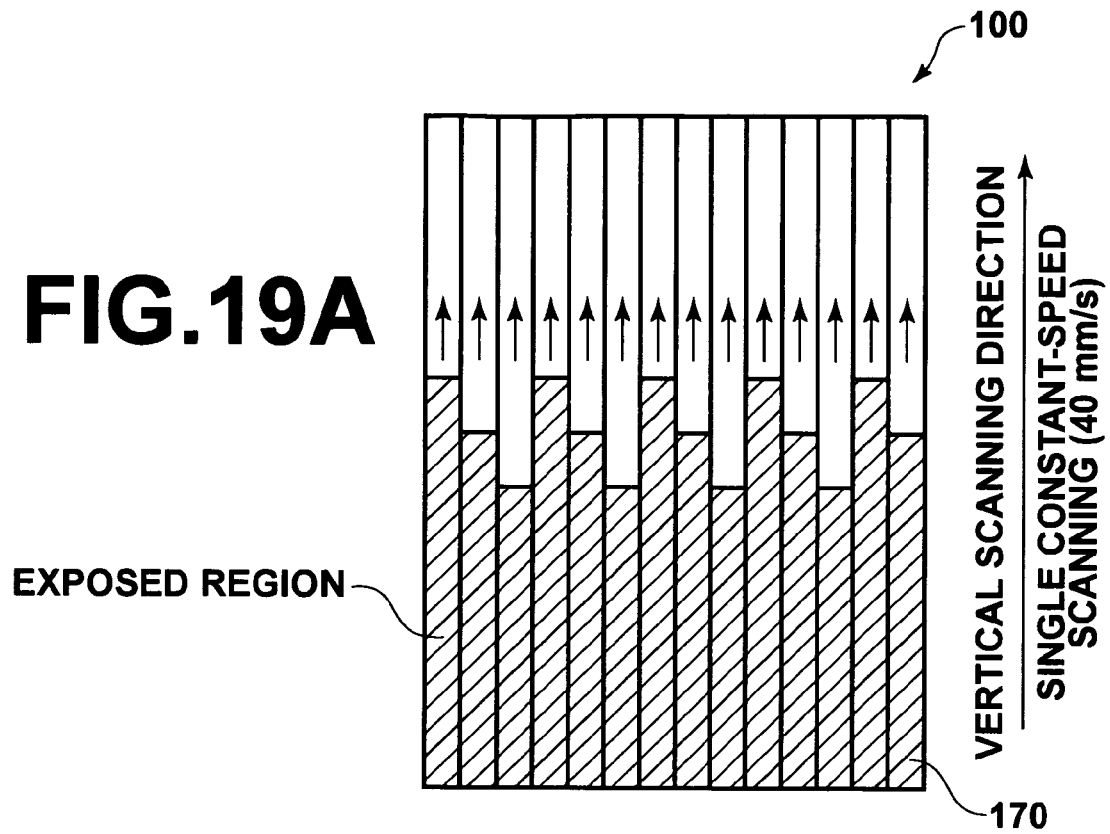
FIG. 19A is a plan view showing exposed regions formed on a photosensitive material.
Figure 19B:
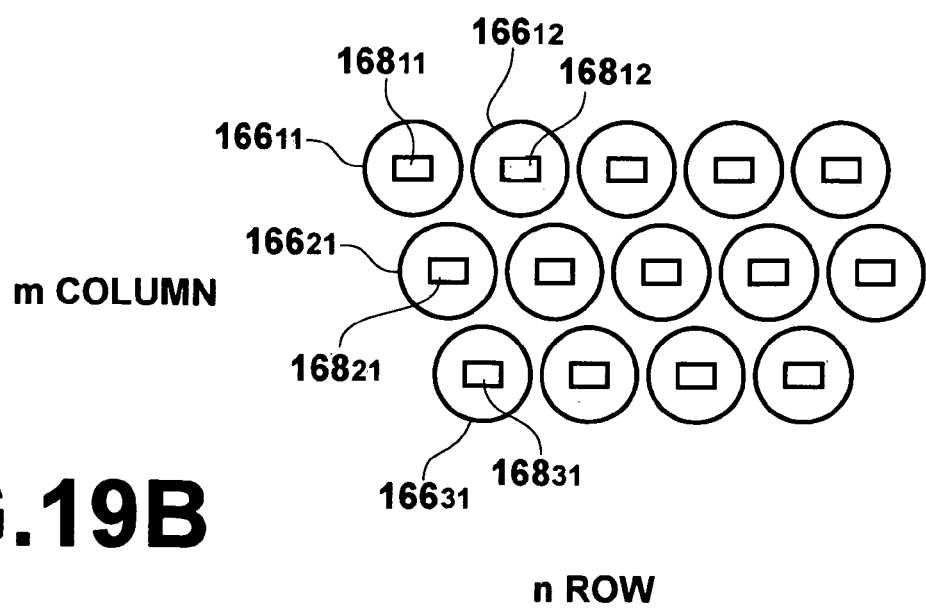
FIG. 19B is a plan view showing an array of exposure areas.

The scanner 162 is equipped with a plurality (e.g., 14) of exposure heads 166 arrayed in the form of a matrix of m rows and n columns (e.g., 3 rows and 5 columns), as shown in FIGS. 18 and 19B. In this example, with relation to the width of the substrate 150, four exposure heads 166 are disposed in the third row. Note that an exposure head arrayed in the $n^{th}$ column of the $m^{th}$ row is represented by an exposure head $166_{mn}$.

An exposure area 168 by the exposure head 166 is rectangular and the short side of the exposure area 168 is arranged in a vertical scanning direction. Therefore, as the stage 152 is moved, a ribbon-like exposed region 170 is formed on the substrate 150 by each exposure head 166. Note that an exposure area by the exposure head arrayed in the $n^{th}$ column of the $m^{th}$ row is represented by an exposure area $168_{mn}$.

As shown in FIGS. 19A and 19B, the exposure heads 166 arranged in the column are shifted a predetermined space (several times the long side of the exposure area, for example, two times in this embodiment) in the row direction so that ribbon-like exposed regions 170 are arranged without a space in the direction perpendicular to the vertical scanning direction. For that reason, a space that cannot be exposed between the exposure area $168_{11}$ and exposure area $168_{12}$ in the first row can be exposed by the exposure area $168_{21}$ in the second row and the exposure area $168_{31}$ in the third row.

Figure 20:
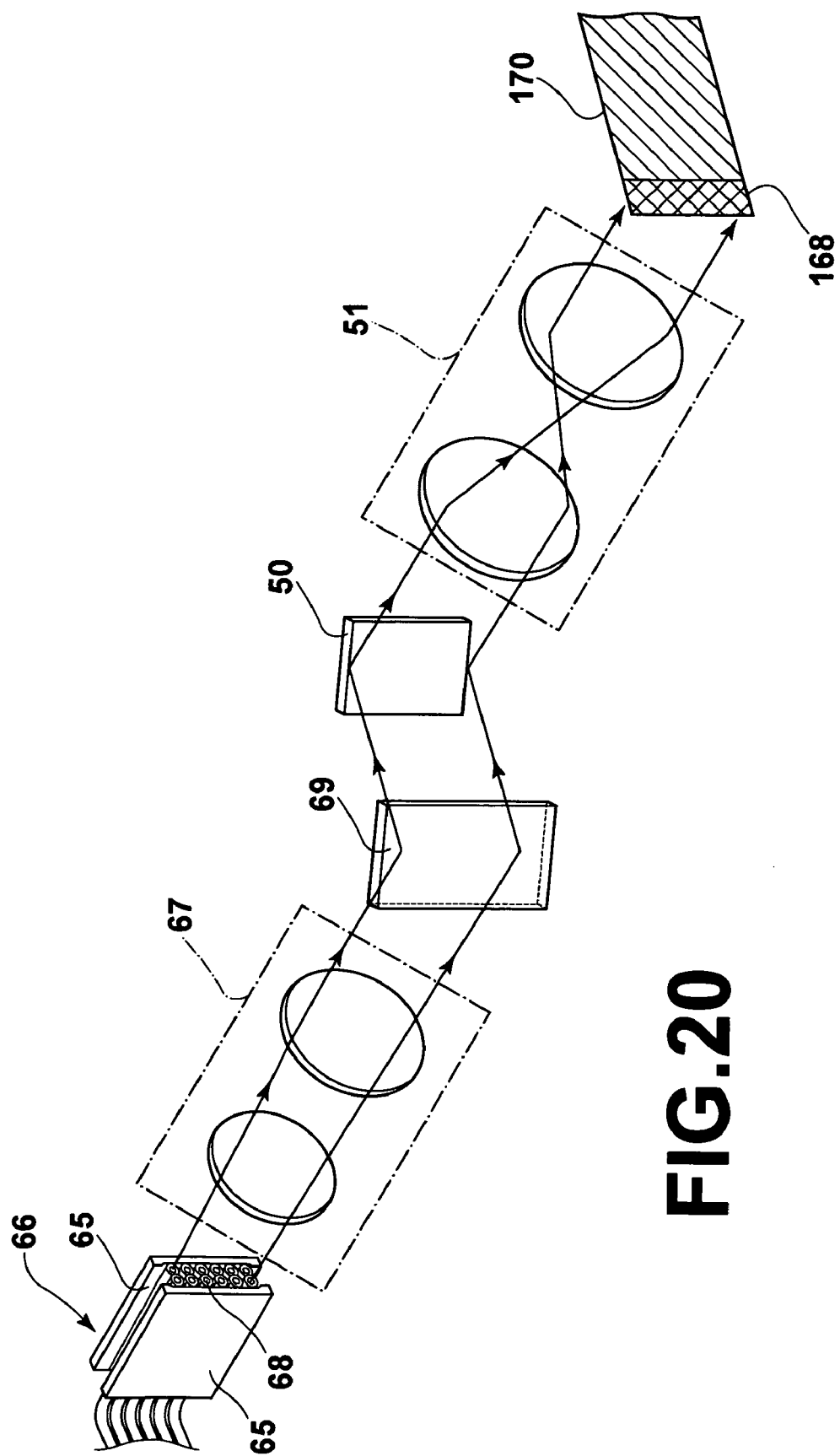
FIG. 20 is a perspective view showing the exposure head of the exposure processing section.
Figure 21:
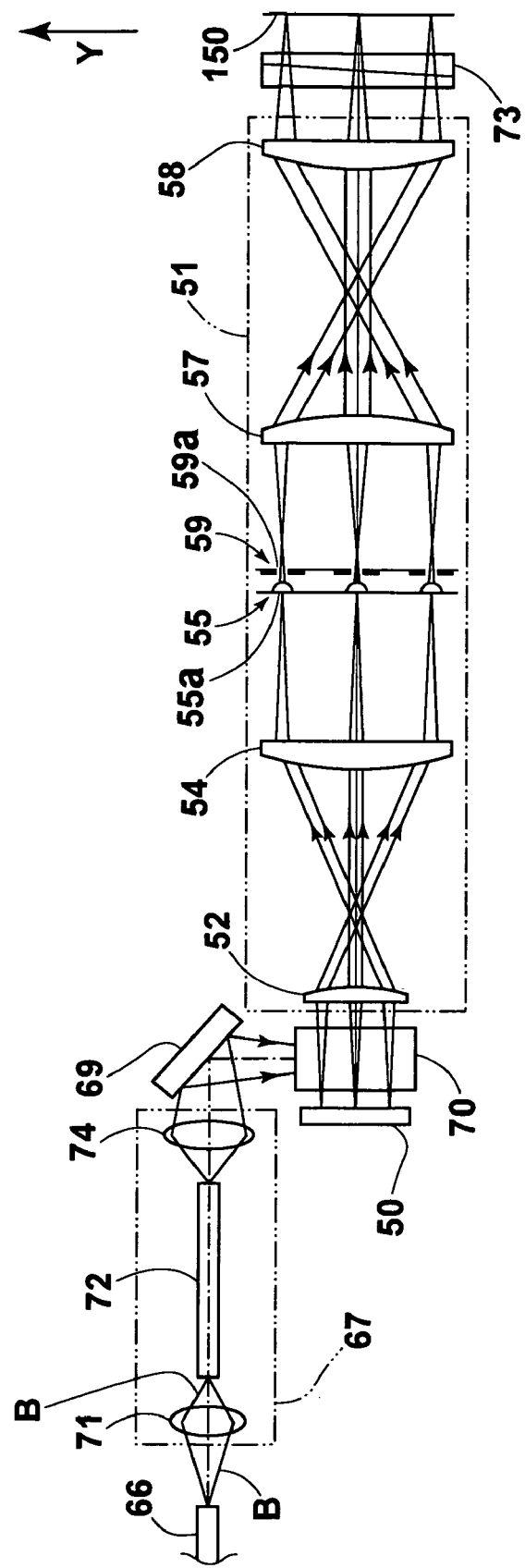
FIG. 21 is a sectional view of the exposure head in a vertical scanning direction along an optical axis.

Each of the exposure heads $166_{11}$ to $166_{mn}$ is equipped with a digital micro mirror device (DMD) 50, which serves as a space-light modulator for modulating an incident light beam for each pixel according to image data, as shown in FIGS. 20 and 21. The DMD 50 is connected to a controller (not shown), which is equipped with a data processing section and a mirror drive section. The data processing section of the controller generates a control signal that drives and controls each of the micro mirrors within a control region of the DMD 50 for each exposure head 166, based on input image data. The mirror drive section controls an angle of the reflecting surface of each micro mirror of the DMD 50 for each exposure head 166, based on the control signal generated by the image data processing section.

A fiber array light source 66, a lens system 67, and a mirror 69 are arranged in the recited order on the light incidence side of the DMD 50. The fiber array light source 66 is equipped with a laser emitting section in which the light emitting ends of optical fibers are arrayed in a row along a direction corresponding to the direction of the long side of the exposure area 168. The lens system 67 corrects the laser light emitted from the fiber array light source 66 and gathers the corrected laser light onto the DMD 50. The mirror 69 reflects the laser light transmitted through the lens system 67, toward the DMD 50. Note in FIG. 20 that the construction of the lens system 67 is simplified.

As shown in FIG. 21, the lens system 67 is made up of a condenser lens 71 gathering laser light B (irradiation light) emitted from the fiber array light source 66, a rod integrator 72 inserted in the optical path of the laser light B passed through the condenser lens 71, and an image forming lens 74 arranged in front of the rod integrator 72, that is, on the side of the mirror 69. The rod integrator 72 converts the laser light emitted from the fiber array light source 66, into a nearly collimated beam of light that is uniform in intensity with in the cross-section. The rod integrator 72 also causes the collimated light beam to strike the DMD 50.

The laser light B emitted from the lens system 67 is reflected at the mirror 69 and is irradiated to the DMD 50 through a total internal reflection (TIR) prism 70.

An imaging optics system 51 is disposed on the light reflection side of the DMD 50 so that the laser light B reflected at the DMD 50 is imaged onto the substrate 150. Note in FIG. 20 that the construction of the imaging optics system 51 is simplified. As shown in FIG. 21, the imaging optics system 51 is made up of a first imaging optics system comprising lenses 52 and 54, a second imaging optics system comprising lenses 57 and 58, and a micro lens array 55 and an aperture array 59 interposed between the first and second imaging optics systems. The micro lens array 55 has a great number of micro lenses 55a corresponding to the pixels on the DMD 50. The micro lens 55a has, for example, a focal distance of 0.19 mm and a numerical aperture of 0.11. The aperture array 59 has a great number of apertures 59a corresponding to the micro lenses 55a of the micro lens array 55.

In the first imaging optics system, an image by the DMD 50 is magnified three times and is imaged on the micro lens array 55. And in the second imaging optics system, the image through the micro lens array 55 is magnified 1.67 times and is imaged onto the substrate 150. Therefore, with the first and second imaging optics systems, an image by the DMD 50 is magnified 5 times and is imaged onto the substrate 150.

In this embodiment, a prism pair 73 is disposed between the second imaging optics system and substrate 150. If the prism pair 73 is moved vertically in FIG. 21, an image on the substrate 150 is brought into focus. Note in FIG. 21 that the substrate 150 is fed in the vertical scanning direction indicated by an arrow Y.

Figure 22:
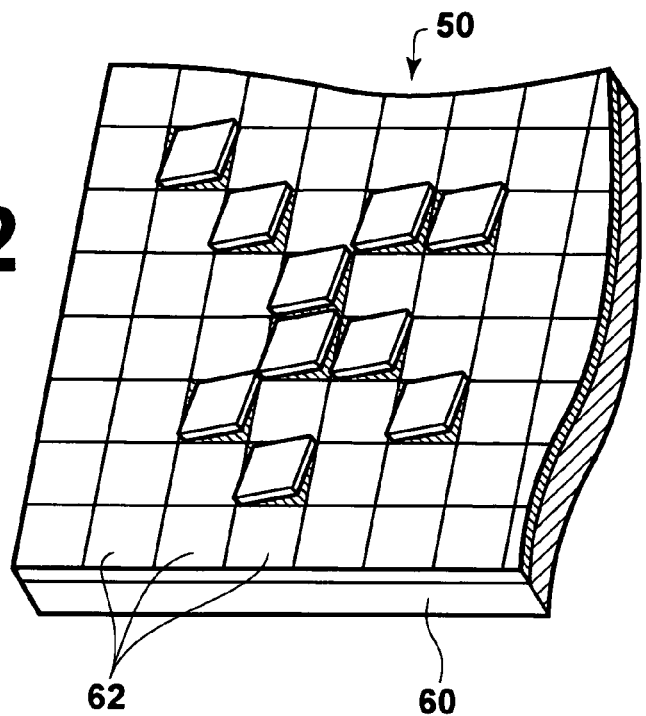
FIG. 22 is a part-enlarged view of the digital micro mirror device (DMD) shown in FIGS. 20 and 21.

The DMD 50 has a micro mirrors 62 supported on a SRAM cell 60 by mirror support posts, as shown in FIG. 22. For example, 1024×768 micro mirrors 62 constituting pixels are arrayed in the form of a lattice. Each pixel is provided with the micro mirror 62 supported by a mirror support post on its uppermost portion. The surface of the micro mirror 62 is coated with a high-reflectance material such as aluminum, etc. Note that the reflectance of the micro mirror 62 is 90% or greater. Also, the DMD 50 has a monolithically integrated structure where a great number of micro mirrors 62 are formed on the SRAM cell 60 of the CMOS silicon gate fabricated in the fabrication of ordinary semiconductor memory, through mirror support posts including a hinge and a yoke.

Figure 23A:
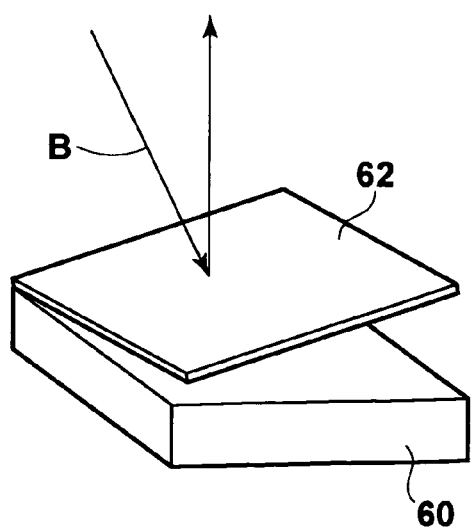
FIGS. 23A and 23B are diagrams used to explain how the DMD operates.
Figure 23B:
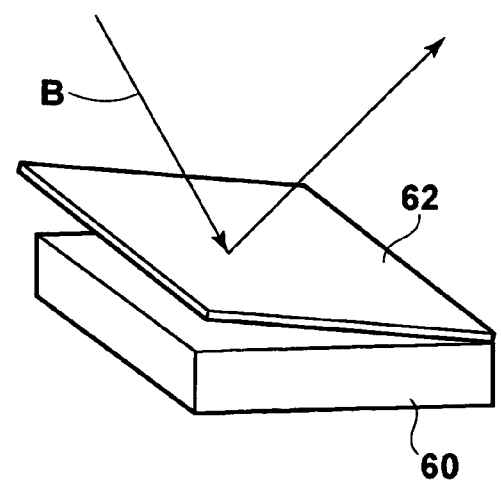

If a digital signal is written to the SRAM cell 60 of the DMD 50, the micro mirror 62 supported by a support post is tilted in a range of ±α degrees (for example, ±10 degrees) to the substrate side on which the DMD 50 is arranged, with the diagonal line as the center. FIG. 23A shows the ON state of the micro mirror 62 in which the micro mirror 62 is tilted at +α degrees. FIG. 23B shows the OFF state of the micro mirror 62 in which the micro mirror 62 is tilted at −α degrees. Therefore, if the tilt of the micro mirror 62 of the DMD 50 constituting a pixel is controlled as shown in FIG. 22 in dependence on an image signal, the laser light B incident on the DMD 50 is reflected in the direction of the tilt of the micro mirror 62.

FIG. 22 enlarges part of the DMD 50 and shows the state in which the micro mirrors 62 are tilted at +α degrees or −α degrees. The on-off control of each micro mirror 62 is performed by the aforementioned controller connected to the DMD 50. Note that there is arranged a light absorbing body in a direction where the laser light B reflected at the micro mirror 62 in the OFF state travels.

Next, the electrical construction of the exposure processing section 16 will be described with reference to FIG. 24. As shown in the figure, an entirety control section 300 is connected to a modulation circuit 301. The modulation circuit 301 acquires binary image data on which a pixel-value replacement process was performed, from the pixel-value replacing section 15 of FIG. 7. The modulation circuit 301 is connected to a controller 302 that controls the DMD 50. The entirety controlling section 300 is also connected to a laser-diode (LD) drive circuit 303 that drives a laser module 64 and to a stage driver 304 that drives the aforementioned stage 152.

Next, operation of the aforementioned exposure processing section 16 will be described. In each of the exposure heads 166 of the scanner 162, laser light emitted from each of the GaN semiconductor lasers constituting the multiplex laser light source of the fiber array light source 66 is collimated by a corresponding collimator lens. The collimated laser light is gathered by a condenser lens and is converged on the entrance surface of the core of a multi-mode optical fiber.

In this embodiment, the collimator lens and the condenser lens constitute a condenser optics system. The condenser optics system and the multi-mode optical fiber constitute a multiplex optics system. That is, the laser light gathered by the condenser lens enters the core of the multi-mode optical fiber and propagates through the optical fiber. The multiplexed laser light is emitted from an optical fiber coupled to the exit end of the multi-mode optical fiber.

In each laser module, when the coupling efficiency of laser light into a multi-mode optical fiber is 0.85 and the output of each GaN semiconductor laser is 30 mW, multiplexed laser light of output 180 mW (=30 mW×0.85×7) can be obtained for each optical fiber of a fiber array. Therefore, 14 multi-mode optical fibers can obtain laser light of 2.52 W (=0.18 W×7).

When performing image exposure, the binary image data on which the aforementioned pixel-value replacement process was performed is input from the modulation circuit 301 of FIG. 24 to the controller 302 of the DMD 50 and is temporarily stored in the frame memory.

The stage 152 held on the surface of the substrate 150 is moved at a constant speed from the upstream side of the gate 160 to the downstream side along the guides 158 by the stage driver 304 shown in FIG. 24. If the front end of the substrate 150 is detected by the sensors 164 as the stage 152 is passed under the gate 160, the image data stored in the frame memory is sequentially read out a plurality of lines at a time, and the data processing section generates a control signal for each exposure head 166, based on the image data read out. In this embodiment, the size of the micro mirror corresponding to 1 pixel is 14 μm×14 μm.

If laser light is irradiated from the fiber array light source 66 to the DMD 50, the laser light reflected when a micro mirror of the DMD 50 is in the ON state is imaged onto the substrate 150 by the first imaging optics system (52, 54) and second imaging optics system (57, 58). In this manner, the laser light emitted from the fiber array light source 66 is turned on-and-off, whereby the substrate 150 is exposed by a number of exposure areas 168 that nearly corresponds to the number of pixels used in the DMD 50. Also, since the substrate 150 is moved at a constant speed along with the stage 152, the substrate 150 is scanned in the vertical scanning direction opposite to the moving direction of the stage 152 by the scanner 162, and a ribbon-like exposed region 170 is formed by each exposure head 166.

If the vertical scanning of the substrate 150 by the scanner 162 is finished, and the rear end of the substrate 150 is detected by the sensors 164, the stage 152 is returned by the stage driver 304 to the original point that is on the most upstream side from the gate 160 along the guides 158, and the stage 152 is again moved at a constant speed from the upstream side to the downstream side.

The operation of the exposure processing section 16 has been described above. In this embodiment, the light source provided in the exposure processing section 16 is a GaN semiconductor laser, as described previously. The wavelength of laser light emitted by a GaN semiconductor laser is 350 to 450 nm, but it is preferable that the wavelength of laser light be 400 to 415 nm. Thus, it is preferable that the wavelength of laser light be selected according to the wavelength sensitivity of the resist film 7.

The exposure processing section 16 may be equipped with different kinds of light sources so that light of wavelength 300 to 10600 nm can be selected as irradiation light. The light source of the exposure processing section 16 may employ a solid laser, a gas laser, etc., in addition to a semiconductor laser diode. Specific examples are a semiconductor laser diode of wavelength about 650 nm, a combination of a YAG laser of wavelength about 532 nm and SHG, a combination of a YAG laser of wavelength about 355 nm and SHG, a combination of a YLF laser of wavelength about 355 nm and SHG, a combination of a YAG laser of wavelength about 266 nm and SHG, an excimer laser of wavelength about 248 nm, an excimer laser of wavelength about 193 nm, a $CO_2$ laser of wavelength about 10600 nm, etc.

As described above, the energy irradiated to the resist film 7 changes, depending on how a pixel-value replacement process is performed for each region in binary image data. Therefore, different amounts of energy can be recorded with a single scanning. That is, the exposure (formation of latent images) shown in FIG. 2B can be performed with a single scanning. This means that the time needed for image recording becomes one-half or less, compared with conventional image recording methods.

Also, when scanning is performed a plurality of times, like a conventional method, a newly recorded pattern is sometimes shifted from previously recorded patterns. However, in this embodiment, all patterns are recorded with a single scanning, so the problem of positional misalignment will not arise. Thus, if the aforementioned resist pattern is formed by this pattern recording system, the problem of productivity can be overcome.

While the present invention has been described with reference to the preferred embodiment thereof, the invention is not to be limited to the details given herein, but may be modified within the scope of the invention hereinafter claimed.

What is claimed is:

1. A method of forming an N-layer mask pattern in N photosensitive layers (N≧2) formed on a substrate by exposure and development, comprising the steps of:

stacking said N photosensitive layers on said substrate so that they becomes lower in sensitivity from the first photosensitive layer which is the bottom layer of said N photosensitive layers, toward the $N^{th}$ photosensitive layer;

forming a first pattern of the same shape as a predetermined pattern to be formed on said substrate, in said first photosensitive layer;

forming a $K^{th}$ pattern in the $K^{th}$ photosensitive layer ($N \geq K \geq 2$) so that said $K^{th}$ pattern is smaller than a $(K-1)^{st}$ pattern formed in the $(K-1)^{st}$ photosensitive layer and arranged inside said $(K-1)^{st}$ pattern; and forming said N-layer mask pattern comprising said N photosensitive layers in which said first to $N^{th}$ patterns are formed.

2. The method as set forth in claim 1, wherein said exposure is performed by employing an exposure system that exposes a surface by imaging a light beam modulated based on a value of each pixel data constituting binary image data, onto said surface.

3. The method as set forth in claim 2, wherein said exposure is performed so that light energy irradiated is increased in stages from an edge of said first pattern toward the center of said $N^{th}$ pattern.

4. The method as set forth in claim 1, wherein said $N^{th}$ pattern is formed so that a distance (t2) from an edge of said $N^{th}$ pattern to an edge of said first pattern is greater than or equal to a total thickness (t1) of said N photosensitive layers excluding a thickness of said first photosensitive layer ($t2 \geq t1$).

5. A method of forming an N-layer mask pattern in N photosensitive layers ($N \geq 2$) formed on a substrate by exposure and development, comprising the steps of:

stacking said N photosensitive layers on said substrate so that they becomes lower in sensitivity from the first photosensitive layer which is the bottom layer of said N photosensitive layers, toward the $N^{th}$ photosensitive layer;

forming a first pattern of the same shape as a predetermined pattern to be formed on said substrate, in said first photosensitive layer;

forming a $K^{th}$ pattern in the $K^{th}$ photosensitive layer ($N \geq K \geq 2$) so that said $K^{th}$ pattern is smaller than a $(K-1)^{st}$ pattern formed in the $(K-1)^{st}$ photosensitive layer and arranged inside said $(K-1)^{st}$ pattern;

forming said N-layer mask pattern comprising said N photosensitive layers in which said first to $N^{th}$ patterns are formed; and etching said substrate by employing said N-layer mask pattern in order to form said predetermined pattern on said substrate.

* * * * *